(12) United States Patent
Dondini et al.

(10) Patent No.: US 12,038,471 B2
(45) Date of Patent: Jul. 16, 2024

(54) ELECTRONIC DEVICE AND CORRESPONDING SELF-TEST METHOD

(71) Applicant: STMicroelectronics S.r.l., Agrate Brianza (IT)

(72) Inventors: Mirko Dondini, Catania (IT); Roberto Crisafulli, San Gregorio di Catania (IT); Calogero Andrea Trecarichi, Aci Catena (IT); Vincenzo Randazzo, Biancavilla (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 345 days.

(21) Appl. No.: 17/406,962

(22) Filed: Aug. 19, 2021

(65) Prior Publication Data

US 2022/0065923 A1 Mar. 3, 2022

(30) Foreign Application Priority Data

Aug. 25, 2020 (IT) .......................... 102020000020422

(51) Int. Cl.
*G01R 31/28* (2006.01)
(52) U.S. Cl.
CPC ..... *G01R 31/2843* (2013.01); *G01R 31/2839* (2013.01)
(58) Field of Classification Search
CPC ............ G01R 31/2843; G01R 31/2839; G01R 31/31703; G01R 31/31701;
(Continued)

(56) References Cited

U.S. PATENT DOCUMENTS

| 5,030,844 A | 7/1991 | Li et al. |
| 6,373,671 B1 | 4/2002 | Watanabe et al. |

(Continued)

FOREIGN PATENT DOCUMENTS

| CN | 101910856 A | 12/2010 |
| CN | 108282234 A | 7/2018 |

(Continued)

OTHER PUBLICATIONS

IT Search Report and Written Opinion for IT Appl. No. 102020000020422 dated Apr. 22, 2021 (7 pages).

(Continued)

*Primary Examiner* — Shelby A Turner
*Assistant Examiner* — Yaritza H Perez Bermudez
(74) *Attorney, Agent, or Firm* — Crowe & Dunlevy LLC

(57) ABSTRACT

An electronic device such as an e-fuse includes analog circuitry configured to be set to one or more self-test configurations. To that effect the device has self-test controller circuitry in turn including: an analog configuration and sensing circuit configured to set the analog circuitry to one or more self-test configurations and to sense test signals occurring in the analog circuitry set to such self-test configurations, a data acquisition circuit configured to acquire and convert to digital the test signals sensed at the analog sensing circuit, and a fault event detection circuit configured to check the test signals converted to digital against reference parameters. The device includes integrated therein a self-test controller configured to control parts or stages of the device to configure circuits, acquire data and control test execution under the coordination of a test sequencer.

9 Claims, 5 Drawing Sheets

(58) Field of Classification Search
CPC .......... G01R 31/31724; G01R 31/3167; G01R 31/006; G01R 31/316; G01R 31/52; G01R 31/74
See application file for complete search history.

(56) References Cited

U.S. PATENT DOCUMENTS

| | | | |
|---|---|---|---|
| 7,340,662 B1* | 3/2008 | McElwee | G01R 31/3167 714/733 |
| 7,813,096 B2 | 10/2010 | Takahashi et al. | |
| 10,566,781 B2 | 2/2020 | Wang et al. | |
| 11,005,253 B2 | 5/2021 | Donath | |
| 11,144,696 B1* | 10/2021 | Sul | G06F 11/261 |
| 2002/0149972 A1* | 10/2002 | Lamb | G01R 31/3167 365/189.09 |
| 2002/0174382 A1 | 11/2002 | Ledford et al. | |
| 2003/0046622 A1* | 3/2003 | Whetsel | G01R 31/318572 714/724 |
| 2003/0184394 A1* | 10/2003 | Lin | H03L 7/18 331/100 |
| 2009/0257162 A1 | 10/2009 | Garrett | |
| 2012/0150477 A1* | 6/2012 | Bruzzano | G11C 29/48 702/120 |
| 2013/0285739 A1* | 10/2013 | Blaquiere | H01L 25/00 29/832 |
| 2014/0184200 A1* | 7/2014 | Milano | G01R 31/2829 324/202 |
| 2014/0347774 A1 | 11/2014 | Uehara | |
| 2016/0172841 A1 | 6/2016 | Lee et al. | |
| 2017/0294774 A1 | 10/2017 | Illing et al. | |
| 2018/0005663 A1* | 1/2018 | Raghuraman | G11C 29/36 |
| 2018/0294643 A1 | 10/2018 | Donath | |
| 2019/0026205 A1 | 1/2019 | Jin et al. | |
| 2019/0178938 A1* | 6/2019 | Jin | G01R 31/3167 |
| 2019/0204385 A1* | 7/2019 | Lei | G01R 31/31713 |
| 2020/0025825 A1* | 1/2020 | Azam | G06F 11/1004 |
| 2020/0116783 A1* | 4/2020 | Kalva | G06F 13/1668 |
| 2020/0266623 A1 | 8/2020 | Letor | |
| 2020/0271722 A1* | 8/2020 | van Oevelen | G01R 31/31932 |
| 2020/0408524 A1* | 12/2020 | Hu | G01C 19/5776 |
| 2022/0065923 A1 | 3/2022 | Dondini et al. | |
| 2022/0190816 A1 | 6/2022 | Castro et al. | |
| 2022/0300389 A1* | 9/2022 | Pandey | G01R 31/3177 |
| 2022/0352705 A1 | 11/2022 | Ramsauer et al. | |
| 2023/0187922 A1* | 6/2023 | Randazzo | H03K 19/20 361/87 |
| 2023/0198514 A1 | 6/2023 | Pavlin et al. | |

FOREIGN PATENT DOCUMENTS

| | | |
|---|---|---|
| CN | 110415751 A | 11/2019 |
| EP | 3159992 A1 | 4/2017 |
| JP | 2001298861 A | 10/2001 |

OTHER PUBLICATIONS

Chen Tao et al: "Built-in self-test and self-calibration for analog and mixed signal circuits", 2019 IEEE International Test Conference, IEEE, Nov. 9, 2019, pp. 1-8, XP033720202.

CN First Office Action and Search Report for counterpart CN Appl. No. 202110974452.X, report dated Mar. 12, 2024, 13 pgs.

* cited by examiner

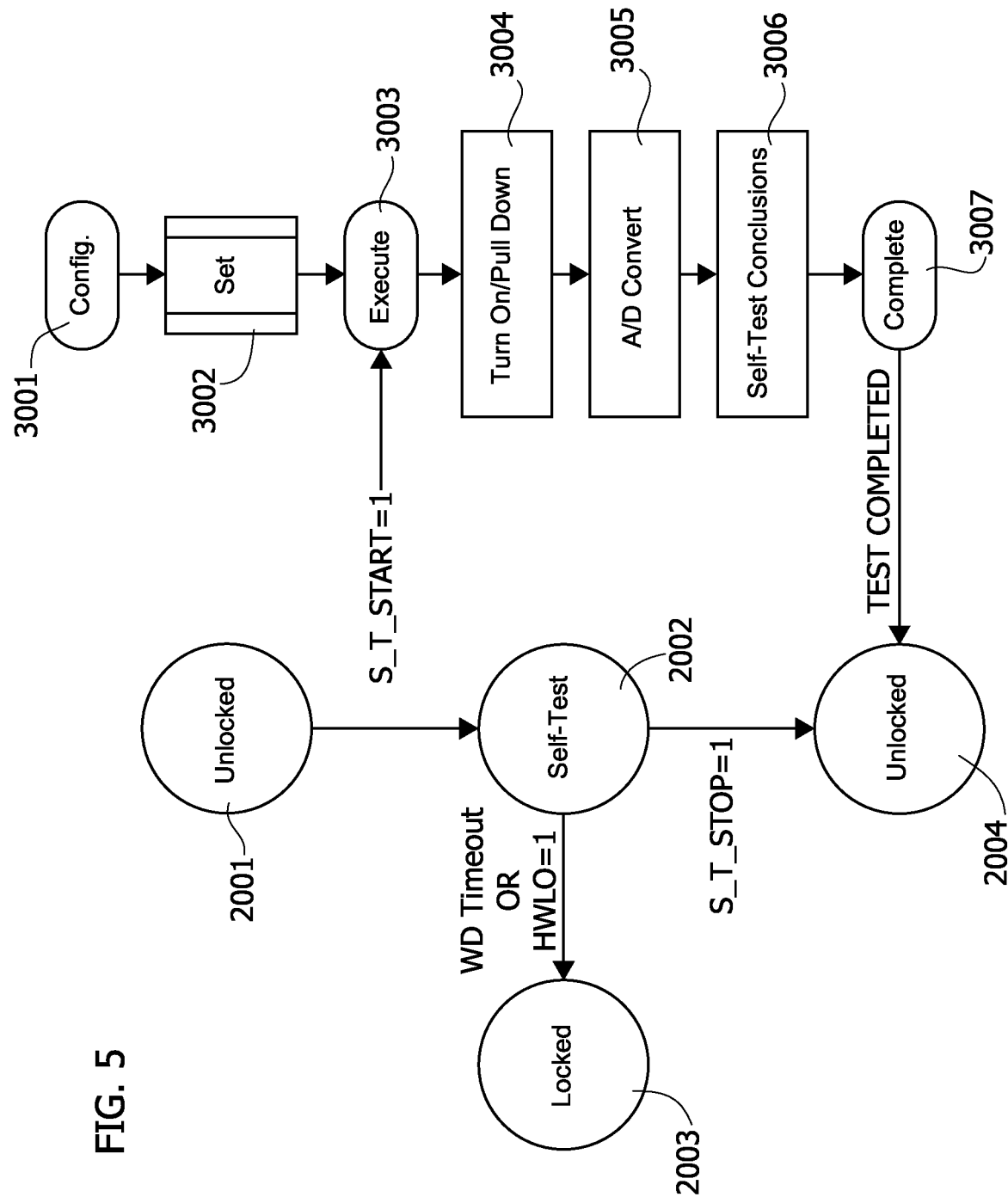

ELECTRONIC DEVICE AND CORRESPONDING SELF-TEST METHOD

PRIORITY CLAIM

This application claims the priority benefit of Italian Application for Patent No. 102020000020422, filed on Aug. 25, 2020, the content of which is hereby incorporated by reference in its entirety to the maximum extent allowable by law.

TECHNICAL FIELD

The description relates to electronic devices. One or more embodiments may be applied to providing self-test capability in electronic devices. One or more embodiments can be applied, for instance, in power controls for car electrification in the automotive sector.

BACKGROUND

Various technical domains may benefit from the availability of devices exhibiting self-test capability.

These domains may include, for instance: power control electronic devices for automotive applications, possibly controlled via host microcontrollers; devices implementing diagnostic and protection functions of power components to facilitate safe controlled behavior in case of faulty conditions; applications with strict specifications on device failure-in-time (FIT <1 for instance); devices capable of detecting right-on-time failing parts with the possibility of taking corresponding actions to facilitate achieving safety conditions; and auto-diagnosis functionalities which remain active during normal operation.

Real-time monitoring of circuit control chains of diagnostic/protection mechanisms related to internal or external power sections may be desirable.

To that effect, desirable features of devices provided with self-test features may include the capability of forcing, sensing, processing and detecting operations in order to check device behavior over time with the capability of communicating malfunction to an embedding system (a host controller, for instance) or to take actions on device hardware in order to implement application safety specifications.

Maintaining device behavior substantially unaltered while certain functionalities are being monitored/tested with data context preserved represents another desirable feature as this facilitates fully restoring operating conditions once certain protection features have been tested.

Another point of interest lies in defining a standard approach and/or a common design architecture portable between different devices. This may improve flexibility in use while also reducing design efforts and development cycles with a consequent beneficial effect on costs.

These factors may facilitate overcoming drawbacks related to "ad-hoc" solutions which may be specific to a certain device and thus hardly compatible with a desired programmable control by a host controller and/or with hardware auto-activation.

This may be the case, for instance, of certain technology currently available with Mentor Tessent based on a DFT proprietary architecture and a serial approach.

Due to its being specific to certain in-field built-in self-test (BIST) applications, such a conventional approach may exhibit poor flexibility and portability between products/platforms. It may also exhibit an intrinsic slowness due to serial access (which makes such a solution hardly suited for latency-critical checks) and may also place constraints on time intervals for in-application tests related to a specific device state.

There is a need in the art to contribute in overcoming the drawbacks outlined in the foregoing.

SUMMARY

One or more embodiments may relate to an electronic device.

One or more embodiments may relate to a corresponding method.

One or more embodiments may offer one or more of the following advantages: a programmable set of in-application self-test procedures for device monitoring; flexible control: single test/sequence execution, serial/parallel execution; reduced development costs related to a self-test set enriched by adding controls and registers; and easier portability between different projects/platforms with similar requirements.

One or more embodiments facilitate architecture standardization in providing a test sequencer with good design configurability and programmability, which may represent a valuable alternative to more specific/ad-hoc solutions.

One or more embodiments are applicable to contexts wherein real-time monitoring of hardware resources is desirable in order to facilitate controlled and safe behavior in case of failure.

One or more embodiments may provide an alternative to the concurrent execution of multiple self-test selections (where applicable); self-test execution can be started under hardware control in certain time windows, in certain specific device states as defined by a finite state machine or FSM and in the presence of well-defined application events, for instance.

In those applications where latency is not critical (so-called "soft" event monitoring) one or more embodiments lend themselves to being implemented in software form via a microcontroller, for instance.

BRIEF DESCRIPTION OF THE DRAWINGS

One or more embodiments will now be described, by way of example, with reference to the annexed figures, wherein:

FIG. 5 is a combined graph/flowchart exemplary of performing tests in embodiments of the present description.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

In the figures, reference 10 denotes as a whole a device (electronic circuit) wherein a set of in-application self-test features is implemented at the architectural level for device protection/diagnostic feature monitoring.

Figure 1A:
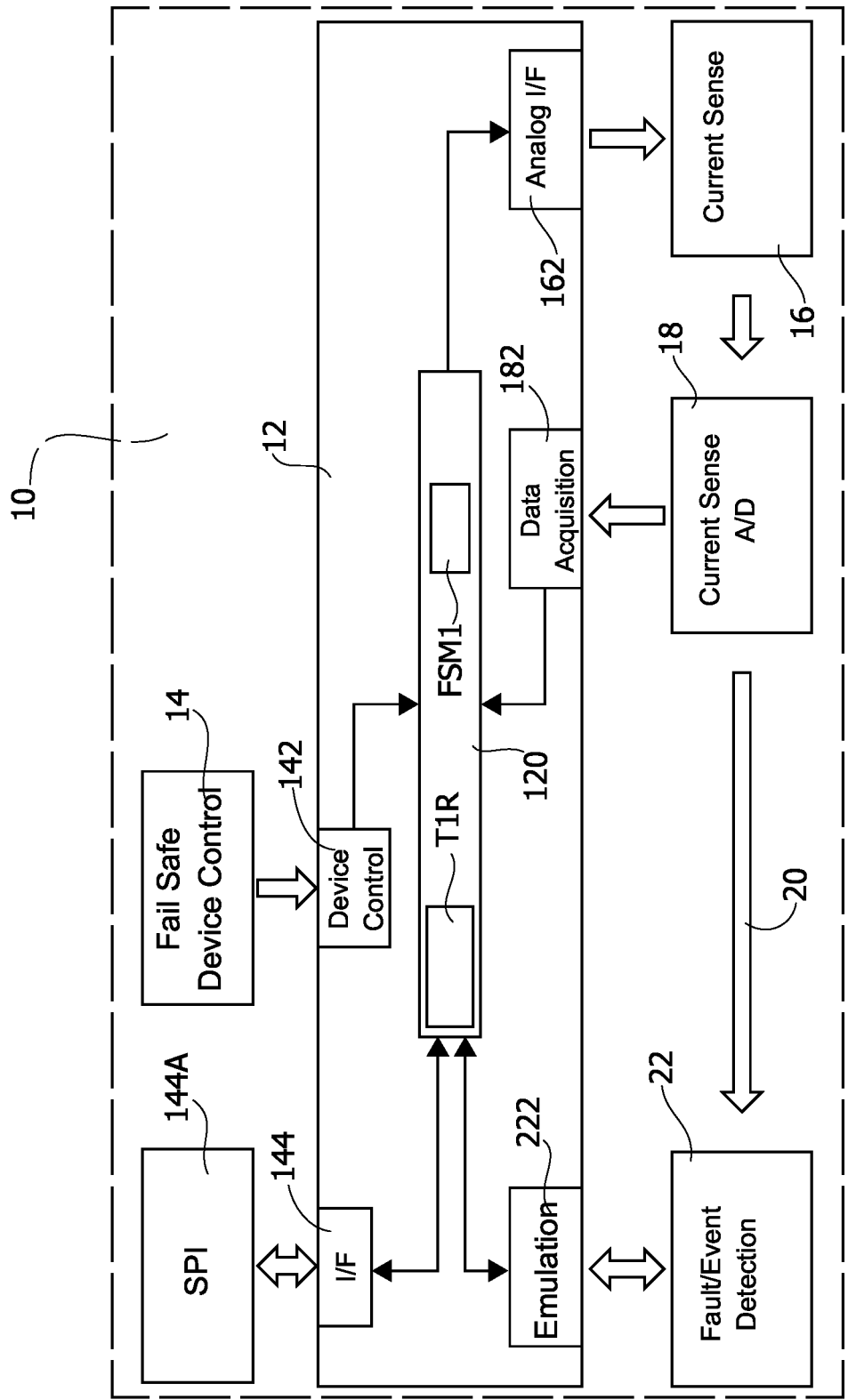
FIGS. 1A and 1B are functional block diagrams exemplary of possible embodiments according to the present description.
Figure 1B:
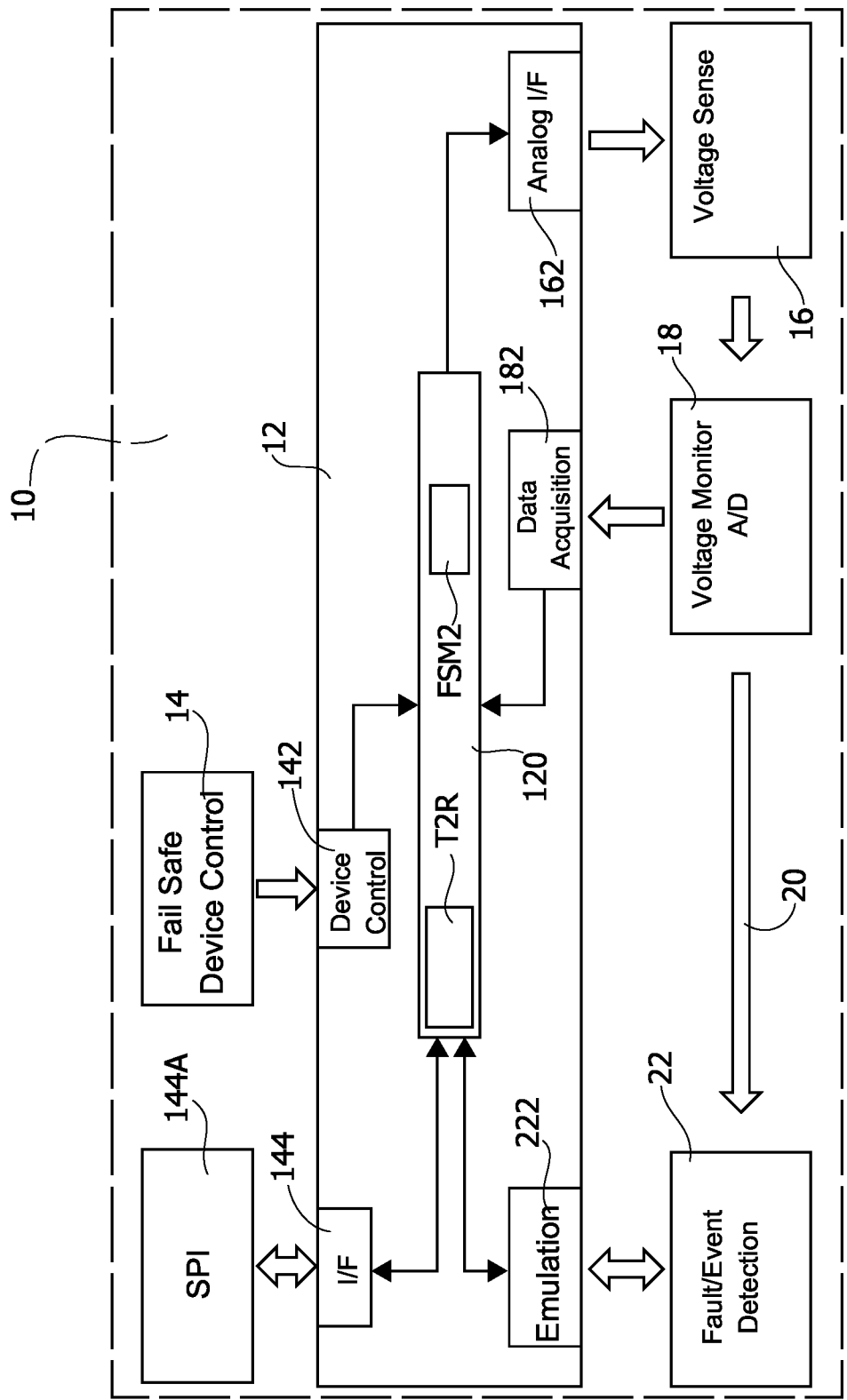

FIGS. 1A and 1B are architectural views of the interaction between an (in application) self-test controller 12 and functionalities as available in mixed analog/digital electronic circuits that can be controlled or observed in order to implement monitor and diagnostic checks.

Those of skill in the art will otherwise appreciate that certain ones of these functionalities may not be visible in the figures insofar as the instant detailed description relates primarily to functionalities discussed as exemplary of functionalities involved in self-test operation as discussed herein.

Functionalities as exemplified in FIGS. 1A and 1B intended to co-operate with a self-test controller such as 12 can be found in a wide variety of electronic devices. While possible application to an e-fuse (electronic fuse) will be discussed in the following by way of example, the embodiments are largely "transparent" to the nature and characteristics of the device 10.

One or more embodiments as exemplified herein may comprise a configurable and programmable digital controller 12 (in-application self-test controller) capable of: managing a set of control signals with the capability of forcing device configurations, acquisition ports for digitally-converted values, data processing and fault/event emulation to execute real-time tests during normal operation of the device 10; and reacting to a possible failure detected, communicating with a host controller (for instance) and/or taking adequate actions for latency/critical situations or specific safety specifications.

In the diagrams of FIGS. 1A and 1i, a block 14 denotes fail-safe device control circuitry which is illustrated here as incorporated to the circuit 10 but may be arranged external to the circuit 10. The circuitry 14 is intended to co-operate with a control interface 142 in the self-test controller 12 exchanging therewith signals such as, for instance, abort/stop control signals from the fail-safe control circuitry 14 to the self-test controller 12 (in order to control operation of the latter), and/or diagnostic/alarm control signals from the self-test controller 12 to the fail-safe device control circuitry 14 (in order to implement low-latency fail-safe protection mechanisms).

Communication can be programmed as desired, for instance, via a programming interface (I/F) 144 for host-controller communication in possible co-operation with a serial peripheral interface (SPI) 144A.

In one or more embodiments, the controller 12 may be configured to co-operate with a number of circuit elements or stages in the device including, for instance, an analog sensing stage 16, an analog-to-digital (A/D) conversion stage 18, and a fault/event detection stage 22 that form the functional backbone of the device 10.

The diagrams of FIGS. 1A and 1B are exemplary of the flexibility of one or more embodiments in adapting to different devices 10 and different contexts of use.

For instance, as exemplified in FIG. 1A: the analog sensing stage 16 may comprise a current sense circuit; the stage 18 may comprise a current sense analog-to-digital (A/D) converter; and the fault/event detection stage 22 may comprise a hard short current (HSHT) and over-current (OVC) detection stage.

Conversely, as exemplified in FIG. 1B: the analog sensing stage 16 may comprise a voltage sense circuit, sensing the drain-to-source of a power field-effect transistor such as a power MOS, for instance; the stage 18 may comprise a voltage monitor analog-to-digital (A/D) converter; and the fault/event detection stage 22 may comprise a voltage monitor fault detection stage.

The foregoing is also (further) exemplary of the fact that, as discussed previously, a device 10 as exemplified herein may comprise alternative/additional functionalities which are not visible in the figures for simplicity.

In one or more embodiments, the analog sensing stage 16 may be configured to co-operate with the controller 12 via an analog (configuration) interface (I/F) 162 in issuing control signals to arrange analog circuitry in the device 10 (not expressly visible in the figure) according to selected self-test configurations.

As illustrated in the foregoing, and as discussed by way of example in the following, in the case of an e-fuse, these self-test configurations may include multiple self-test selection options (whose execution may be managed sequentially via corresponding hardware) such as: external short circuit fault detection chain monitoring; external power MOS saturation fault detection chain monitoring; and external power MOS stuck-on detection monitoring.

An A/D conversion stage 18 as illustrated herein may be configured for acquisition of digital-converted measurements in the device 10 for data elaboration and/or checking.

To that effect, data thus collected by the stage 18 can be transferred to the controller 12 via a data acquisition interface 182.

As exemplified, a fault/event detection stage 22 as illustrated herein may be configured to co-operate with a fault/event emulation interface 222 in the controller 12 in setting configuration design parameters (thresholds and like, for instance) for fault/event generation and/or emulation.

As illustrated, a datapath configuration feature (as schematically represented by 20) can be provided intermediate to the acquisition circuitry 18, 182 and the fault event detection circuitry 22, 222 in order to facilitate a plurality of digital processing datapath configurations for the test signals converted to digital.

Various suitable types of computation (for instance, differential or delta measurements on data acquisition) can be implemented in the self-test controller 12.

In one or more embodiments, self-test configuration and execution can be programmed via a Serial Peripheral Interface (SPI) such as 144A.

For instance, such an interface can be configured to exchange data between microcontrollers and small peripherals such as shift registers, sensors, and SD cards.

In one or more embodiments, dedicated registers and fields can be mapped within a device address space with the capability of reporting status for each self-test run. For instance, IDLE/RUN/END/ABORT test information may be made available to a host controller through registers mapped in device address space.

Figure 2:
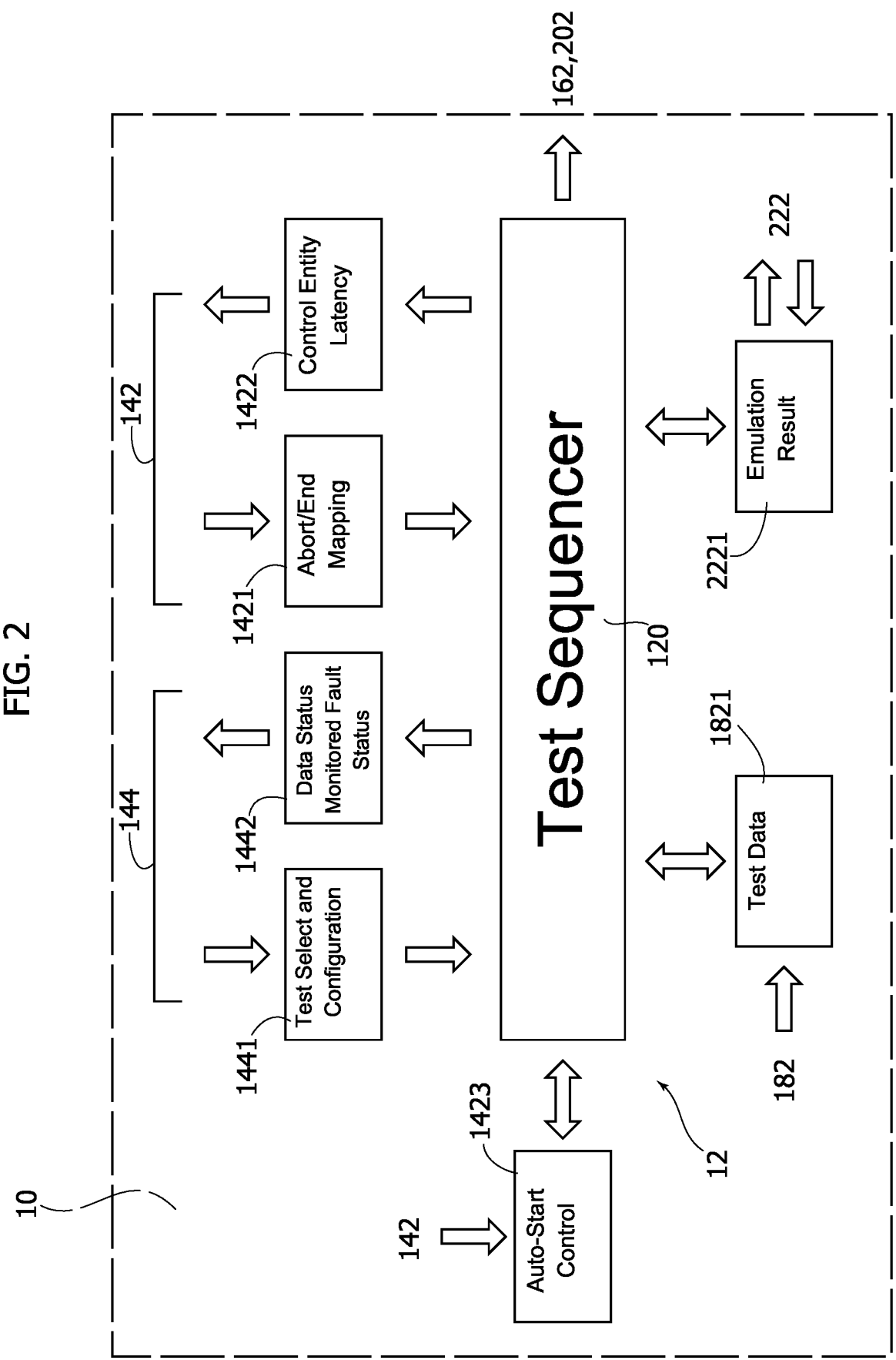
FIG. 2 is a functional block diagram exemplary of possible details of implementation of embodiments.

The block diagram of FIG. 2 is an exemplary representation of a possible embodiment of a controller 12 as included in a device 10 as illustrated in FIGS. 1A and 1B. The main functionality of a controller 12 as illustrated herein may be represented by a test sequencer circuit (briefly, test sequencer) 120.

The test sequencer 120 can be configured to control the execution of defined self-tests to be run, with other (internal) functionalities of the self-test controller 12 intended to interact with the interfaces described previously in connection with FIGS. 1A and 1B.

By way of example, the block diagram of FIG. 2 shows the self-test controller functionality interacting with the device control interface 142 configured to receive and transfer to the test sequencer 120 Abort/End control signals from control sources (at 1421) while issuing towards the device control entity latency critical control information (at 1422).

Similarly, the self-test controller functionality interacting with the programming interface 144 may be configured to receive, decode and transfer to the test sequencer 120 test selection and configuration data (at 1441) while collecting into registers and transferring from test sequencer 120 data/status information and monitored fault checks for each executed self test (at 1442)

The diagram of FIG. 2 is also exemplary of the device control interface 142 being configured to exchange with the test sequencer 120 auto-start control information at 1423, for those cases or tests in which execution is started according to hardware conditions and not controlled by software through a programming interface such as 144, 1441.

As exemplified in FIG. 2, the self-test controller 12 can also be configured, according to the test under execution, to issue analog and datapath configuration control via the interface 162, to receive test data from digital datapath, via the interface 182, and elaborate/check the information received at 1821 (for example, by performing delta measurements). In addition, the self-test controller 12 can be configured to manage the selection of a protection fault under test, by disabling the real fault flag of the device, to avoid false faults signaling, and by collecting the result of the emulation of fault/event detection under test via the interface 222 at 2221.

Figure 3:
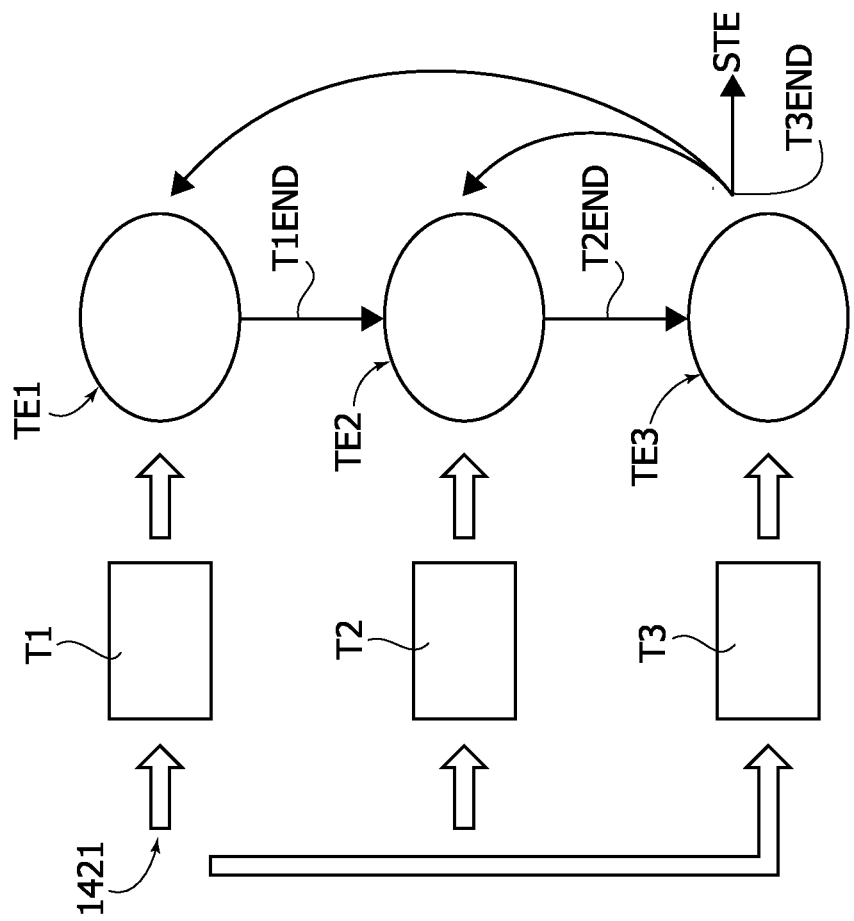
FIG. 3 is a diagram exemplary of possible operation of a test sequencer in embodiments of the present description.

FIG. 3 is exemplary of a possible solution which may be adopted in the test sequencer 120 in order to provide Abort/End mapping information for various tests starting from information as provided to the controller 12 at 1421.

FIGS. 1A and 1B as discussed in the foregoing are exemplary of circuits (stages) which may be involved in a self-test procedure in the case of current sensing (FIG. 1A) and in the case of voltage (Vds) monitoring (FIG. 1). The test sequencer 120 in the self-test controller 12 can be configured to execute such a procedure via a dedicated finite state machine (FSM) for each of these two tests, namely FSM1, cooperating with "Test1" registers T1R in a first test (FIG. 1A), and FSM2, cooperating with "Test2" registers T2R in a second test (FIG. 1).

FIG. 3 is exemplary of an embodiment of the test sequencer 120 configured to execute three tests, T1, T2, T3, with corresponding test enable signals TE1, TE2, TE3 derived from configuration selection information received at 1441. Each test involves a respective finite state machine FSM1, FSM2 and FSM3, with the three FSMs linked together in order to be able to support both single (individual) test runs and sequences of tests (for instance sequences of two or three tests as exemplified herein).

As exemplified in FIG. 3, the completion of execution of T1, controlled by FSM1, generates a signal T1END which, in response to being enabled by TE2, starts execution of test T2, controlled by FSM2; likewise, completion of test T2 by FSM2 generates a signal T2END which, in response to being enabled by TE3, starts of execution of T3 controlled by FSM3.

As exemplified in FIG. 3, the completion of the execution of last test (T3 by FSM3, for instance) generates a signal T3END to notify the preceding FSMs (here, FSM1 and FSM2) that the test sequence has been completed.

In that way, each FSM can transition to its IDLE state (as discussed in the following in connection with FIG. 4), together with the generation of a self-test end signal STE that notifies the device 10 comprising the self-test controller 12 that the test sequence has been completed with corresponding data/status information available in related registers, accessible through the programming interface 144, 1442, as depicted in FIG. 2.

FIG. 3 illustrates exemplary signals exchanged between the FSMs discussed previously and which facilitate starting and/or terminating execution of each self-test.

For instance, in response to execution of FSM3 being terminated (T3END), a signal can be generated for FSM2 and FSM1 to complete execution thereof and/or transition to an IDLE state (STE), as discussed in connection with FIG. 4.

Figure 4:
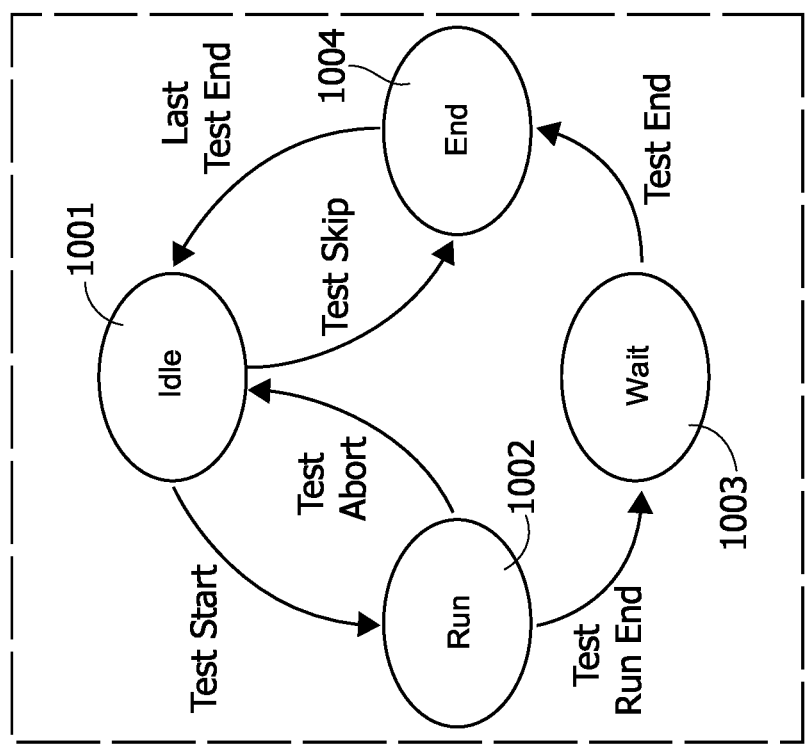
FIG. 4 is a graph exemplary of possible operation of a finite state machine (FSM) in embodiments.

FIG. 4 is exemplary of a possible arrangement of a finite state machine configured to execute a certain test, that is FSM1 or FSM2 or FSM3 in FIG. 3, and including four states, namely: a self-test idle state at 1001; a self-test run state at 1002; a self-test wait state at 1003; and a self-test end state 1004.

As exemplified in FIG. 4, the state of the FSM may transition from self-test idle at 1001 to self-test run 1002 in response to a Test Start signal with the possibility for the FSM to return from the self-test run state 1002 to the self-test idle state in response to a Test Abort signal under the control of device fail-safe functionality, in order to stop (immediately) self-test execution.

Transitions of the FSM from the self-test run state 1002 to the self-test end state 1004 via the self-test wait state 1003 may result from a Test Run End signal and a Test End signal subsequently issued.

A self-test wait state 1003 is advantageously introduced to allow (analog) circuits under test to return to their normal configuration and operation after the self-test execution is completed and the specific circuit configuration needed to run the test has been removed.

Finally, transitioning from the self-test end state 1004 back to the self-test idle state at 1001 may be in response to a Last Test End signal with the possibility for the machine to transition from the self-test idle state 1001 to the self-test end state 1004 in response to a Test Skip signal received from the "last" FSM of the test sequencer 120, indicating the end of the execution of a programmed/configured self-test sequence.

The transition from self-test idle state 1001 to the self-test end state 1004 in response to a Test Skip signal facilitates skipping the execution of a test in case this is not included in the test sequence as configured. By way of example, referring to FIG. 3, if the programmed self-test sequence comprises the execution of T1 and T3 (not T2), once T1 completed and the T2 FSM (notionally) enabled, assertion of the Test skip signal facilitates moving directly to the respective self-test end state 1004 (without T2 being actually executed) enabling the FSM ofr T3 to start.

FIG. 5 is a mixed graph/flowchart representation exemplary of an embodiment applied to a device 10 embedding, by way of example, electronic fuse (e-fuse) functionalities.

In the exemplary case discussed herein, such a device 10 is equipped with a self-test controller 12 as discussed in the foregoing. For instance, the device (electronic fuse) 10 can be configured to transition from an unlocked state 2001 (normal operation) to a self-test state 2002, in response to a corresponding (auto) start signal being asserted, for instance S_T_START=1 (see 142, 1423 in FIG. 2, for instance).

As exemplified in FIG. 5, permanence in the self-test state 2002 is conditioned upon a watchdog (WD) for a possible expiration of a timeout interval and/or upon a hardware lockout condition (HWLO=1), both being examples of abort signals as previously mentioned coming from device failsafe control logic. This may result, for instance, in self-test sequence execution being aborted and in a correspondent transition of the device finite state machine from the self-test state 2002 to a fail-safe state, a so called locked state 2003 in the current example.

Otherwise, as result of self-test completed, the system transitions back to an unlocked state 2004. For instance, this may be in response to a stop signal S_T_STOP=1 being asserted (see again 142, 1423 in FIG. 2, for instance) or in response to a stop signal S_T_STOP=1 being asserted from programming interface or device control (see 144-1441 or 142-1421 in FIG. 2).

The right-hand side of FIG. 5 is exemplary of a possible sequence of steps or acts performed by the self-test controller 12 after activation by the device 10 (e-fuse in this case) with corresponding device FSM control transitions (UNLOCKED→SELFTEST→UNLOCKED).

The step or act 3001 is exemplary of a current sense self-test configuration for an e-fuse (considered herein as exemplary of the device 10) which leads to current sense self-test configuration parameters being set at 3002, for instance:

CR#1 ➔ S_T_CFG[2:0]=xx1 (x meaning a "don't care" bit)

CR#2 ➔ OVC_THR=<user option>

CR#3 ➔ HSHT_THR=<user option>

For instance: the first parameter CR #1 may be indicative of the selected self-test user wants to perform; in an embodiment, the least significant bit (S_T_CFG(0)) of a configuration word S_T_CFG[2:0] may select a current sense self-test execution; and the two latter parameters CR #2 and CR #3 may be indicative of user-selected thresholds OVC_THR and HSHT_THR set for an over current (OVC_THR) fuse limit check or for a hard short current (HSHT_THR) limit check, in order to test proper behavior of current sense protections activation.

The block designated 3003 is exemplary of current sense self-test being executed (in response to S_T_START=1 being asserted).

The blocks 3004, 3005 and 3006 illustrated in FIG. 5 are exemplary of various acts which may be implemented via the stages 16, 18 and 22 in the device 10 in co-operation with the self-test controller 12 in FIGS. 1A and 1B.

Such acts may comprise: block 3004—turn-on/pull-down a current generator in the e-fuse 10 to produce an (additional) voltage drop on a current sense amplifier input in accordance with a selected self-test configuration;

block 3005—analog-to-digital (A/D) conversions of current sense circuit measurements, according to 3004, with optional differential measurements performed between self-test measures and, for instance, a last measurement performed before the device 10 enters a self-test state, available as stored in device status register, in order to check proper functionality of all current sense measurement circuit chain. Also, A/D conversions may be used in combination with OVC and HSHT threshold settings (CR #2 and CR #3) to verify if fault protection is activated in case the converted values exceed selected thresholds, thus covering with the selected self-test also the protection trigger. Self-test measurements of both differential conversion and protection fault emulation check results can be made available on status registers of the device 10;

block 3006—self-test conclusion with the current generator in the e-fuse turned off/pulled down to restore normal drop on the current sense amplifier inputs with current sense A/D conversion discontinued during these timeframe.

The blocks 3004 and 3005 may have a (joint) TS_T_ACTIVE time duration and the block 3006 may have TS_T_WAIT time duration in order to have a self-controlled test duration and a safe transition from self-test configuration to normal operating mode configuration.

During the TS_T_ACTIVE and TS_T_WAIT timeframes, Fast and Slow trip protections of the e-fuse corresponding to hard short (HSHT) and over current (OVC) conditions as discussed previously may be inhibited in order to allow their functional check, while avoiding to affect the device 10 (e-fuse, for instance), that continues to operate whilst all other protections are active.

The block 3007 in FIG. 5 is exemplary of the completion of a self-test procedure (current sense, for instance) with a TEST COMPLETED signal sent back to the device control (block 14 and interface 142 in FIGS. 1A and 1B) so that the device (e-fuse, for instance) can be returned to the unlocked state as exemplified by 2004.

As discussed, FIG. 5 is exemplary of application of embodiments to self-test configurations which are programmable through a serial peripheral interface (SPI) of the device with dedicated registers and fields mapped within device address space and multiple self-test configurations supported with execution managed sequentially via hardware.

The (purely exemplary) case considered refers to an electronic device 10 comprising an electronic fuse (e-fuse).

Such a device 10 may comprise analog sensing circuitry (see block 16 in FIGS. 1A and 1B) configurable (via the interface 162) to a plurality of self-test configurations comprising, for instance: an external short circuit fault detection chain monitor; an external power MOS saturation fault detection chain monitor; and an external power MOS stuck-on detection monitor, with such an analog sensing circuitry capable of sensing respective (voltage and(or current) test signals occurring in the analog circuitry when set to those self-test configurations.

Similarly, it will be assumed that, in the (purely exemplary) case considered herein, digital processing circuitry (of any known type to those of skill in the art for that purpose) may be provided in order to perform processing as desired on data acquisitions (for instance, differential or "delta" measure computation and/or comparison against certain thresholds).

It will be likewise assumed that status reporting for each self-test run as well as IDLE/RUN/END/ABORT test information is available to host controller through registers mapped in device address space.

Table I and Table II below are exemplary of (purely indicative and non-limiting) values for control and status register bits and fields which may be adopted in order to control and monitor, via a programmable interface, self-test applications in a device 10 embedding a self-test controller 12 as discussed in the foregoing.

Specifically, Table I is exemplary of a device control register view for self-test software configuration and control, with the columns in the table being indicative of: $1^{st}$ column: bit position in control register dedicated to self-test; $2^{nd}$ column: default value at reset; $3^{rd}$ column: bit/field name; and $4^{th}$ column: functional description according to the embodiment considered.

TABLE I

Device control register view

| Bit position | Default value at reset | Transition signal (Bit/field name) | Functional description | |
|---|---|---|---|---|
| 9 | 0 | S_T_START | When set to 1, starts selected self-test If current state is Unlocked and S_T_GFC is not 0000, then setting this bit causes a transition to Self-Test state. This bit is automatically reset. | |
| 8 | 0 | S_T_STOP | When set to 1, stops execution of selected self-test (when applicable). This bit is automatically reset | |
| 7:5 | 000 | S_T_CFG | Self-test selection | |
| | | | S_T_CFG | Self-test selected |
| | | | 000 | No selection |
| | | | 001 | Current sense |
| | | | 010 | VDS Detection |
| | | | 100 | Power Switch Stuck-on |
| | | | 011 | Current Sense + VDS Detection |
| | | | 101 | Current Sense + Power Switch Stuck-on |
| | | | 110 | VDS Detection + Power Switch Stuck-on |
| | | | 111 | Current Sense + VDS Detection + Power Switch Stuck-on |
| | | | Others | Reserved |

Conversely, Table II is exemplary of a device status register view for self-test software configuration (current sense, for instance), with the columns in the table being indicative of: $1^{st}$ column: bit position in device status register; $2^{nd}$ column: default value at reset; $3^{rd}$ column: bit/field register name; $4^{th}$ column: functional description according to the embodiment discussed as example; and $5^{th}$ column: bit/field reset policy (per se not relevant for the embodiments).

TABLE II

Device status register view

| Bit position | Default value at reset | Transition signal (Bit/field name) | Functional description | |
|---|---|---|---|---|
| 14 | 0 | S_T_HSHT | This bit is set if HSHT_THR is reached during CURRENT SENSE self-test (Emulation of hard short fault, as result of comparison between self-test current sense A/D conversion and hard short threshold setting) | R/C |
| 13 | 0 | S_T_OVC | This bit is set if OVC_THR is reached during CURRENT SENSE self-test Emulation of over current protection fault, as result of comparison between self-test current sense A/D conversion and over current threshold setting | R/C |
| 12 to 3 | 0000000000 | S_T_CURR | 10-bit ADC conversion of the CURRENT SENSE, performed during CURRENT SENSE self-test (storage of A/D conversion performed during self-test) | R/C |
| 2 + 1 | 00 | S_T_CURR_STATUS | Status of CURRENT SENSE self-test 00 > IDLE: Self-test not started 01 > RUN: Self-test execution in progress 10 > END: Self-test completed successfully (consistent data available on dedicated registers 00 > ABORT: Self-test aborted (watchdog timeout, HWLO, S_T_STOP when not required) | R/C |

An electronic device (for instance, a device 10 embedding an e-fuse) as exemplified herein may comprise analog circuitry configured to be set to at least one self-test configuration, as well as self-test controller circuitry (for instance, 12) in turn comprising: an analog configuration and sensing circuit (for instance, 16, 162) configured to set said analog circuitry to at least one self-test configuration and to sense test signals occurring in said analog circuitry set to said at least one self-test configuration; a data acquisition circuit (for instance, 18, 182) configured to acquire and convert to digital said test signals sensed; and a fault event detection circuit (for instance, 22, 222) configured to check said test signals converted to digital against reference parameters.

In an electronic device as exemplified herein, the self-test controller circuitry may comprise test coordination circuitry (for instance, the test sequencer 120) having an input port (for instance, 142, 1421) configured to receive device control signals indicative of a set of self-test events, wherein said analog configuration and sensing circuit (for instance, 16, 162) is configured to set (for instance, T1, T2, T3) said analog circuitry to a plurality of self-test configurations (for instance, TE1, TE2, TE3) as a function of device control signals received at said test coordination circuitry.

The test sequencer 120 extensively discussed in the foregoing may be exemplary of such test coordination circuitry configured to co-ordinate performance of plurality of self-tests.

This may occur in a certain "serial" sequence as described herein for simplicity.

Those of skill in the art will otherwise appreciate that one or more embodiments may contemplate tests performed at least partly concurrently, that is in parallel to one another.

In an electronic device as exemplified herein, said test coordination circuitry (as exemplified by the sequencer 120) may comprise a finite state machine (for instance, 1001, 1002, 1003, 1004) sensitive to transition signals (for instance, ST_T_START, S_T_STOP) causing said test coordination circuitry to transition between idle states (for instance, 2001, 2004) through a self-test state (for instance, 2002) during which said analog configuration and sensing circuit (16, 162) sets said analog circuitry to said at least one self-test configuration.

In an electronic device as exemplified herein, said finite state machine in said test coordination circuitry may be configured to transition to a locked state (for instance, 2003) in response to a self-test being aborted during said self-test state (for instance, 2002).

In an electronic device as exemplified herein, said self-test controller circuitry may comprises a datapath configuration circuit (for instance, 20), intermediate said data acquisition circuit (18, 182), and said fault event detection circuit (22, 222), the datapath configuration circuit configured to provide a plurality of digital processing datapath configurations for said test signals converted to digital.

A method of operating an electronic device as exemplified herein may comprise activating (for instance, 142, 1423) said self-test controller circuitry wherein, in response to said self-test controller circuitry being activated: said analog configuration and sensing circuit sets said analog circuitry to at least one self-test configuration and senses test signals occurring in said analog circuitry set to said at least one self-test configuration; said data acquisition circuit acquires and converts to digital said test signals sensed; said fault event detection circuit checks said test signals converted to digital against reference parameters and issues at least one fault detection signal (for instance, 1442) in response to said checking indicating said test signals converted to digital failing to match said reference parameters.

In a method as exemplified herein, activating said self-test controller circuitry may comprise an auto-start control (for instance, 1423) of said self-test controller circuitry.

In a method as exemplified herein, activating said self-test controller circuitry may comprise activating a plurality of self-test events (in a method as exemplified herein, T1, TE1; T2, TE2; T3, TE3), wherein said analog configuration and sensing circuit sets said analog circuitry to a plurality of self-test configurations.

Without prejudice to the underlying principles, the details and embodiments may vary, even significantly, with respect to what has been described by way of example only, without departing from the extent of protection.

The claims are an integral part of the technical teaching provided herein in respect of the embodiments.

The invention claimed is:

1. An electronic device, comprising:
    analog circuitry configured to be settable to at least one self-test configuration; and
    self-test controller circuitry, comprising:
        test coordination circuitry having an input port configured to receive device control signals indicative of a set of self-test events;
        an analog configuration and sensing circuit configured to set said analog circuitry to a plurality of different self-test configurations as a function of said device control signals received by the test coordination circuitry, and to sense test signals occurring in said analog circuitry set to said plurality of different self-test configurations;
        a data acquisition circuit configured to acquire and digitize said sensed test signals; and
        a fault event detection circuit configured to check said digitized sensed test signals against reference parameters;
        wherein said test coordination circuitry comprises a finite state machine operating responsive to transition signals causing said test coordination circuitry to transition between idle states through a self-test state during which said analog configuration and sensing circuit sets said analog circuitry to said plurality of different self-test configurations, said finite state machine being configured to transition to a locked state in response to a self-test being aborted during said self-test state.

2. The electronic device of claim 1, wherein said self-test controller circuitry comprises a datapath configuration circuit coupled between said data acquisition circuit and said fault event detection circuit, the datapath configuration circuit configured to provide a plurality of digital processing datapath configurations for said digitized sensed test signals.

3. A method of operating an electronic device having analog circuitry and self-test controller circuitry for cooperating with the analog circuitry to perform testing of the electronic device, the method comprising:
    activating the self-test controller circuitry;
    in response to activation of the self-test controller circuitry, setting the analog circuitry to a plurality of different self-test configurations as a function of device control signals received by a finite state machine that transitions through a self-test state in which the analog circuitry is set to the plurality of different self-test configurations and that transitions to a locked state in response to a self-test being aborted during the self-test state, and then sensing test signals occurring in the analog circuitry;
    acquiring and digitizing the sensed test signals;
    checking the digitized sensed test signals against reference parameters; and
    generating at least one fault detection signal in response to the checking indicating that the digitized sensed test signals fail to match the reference parameters.

4. The method of claim 3, wherein activating said self-test controller circuitry comprises performing an auto-start control of said self-test controller circuitry.

5. The method of claim 3, wherein activating said self-test controller circuitry comprises activating a plurality of self-test events when an analog configuration and sensing circuit is configured to set said analog circuitry to said plurality of different self-test configurations.

6. An electronic device, comprising:
    analog circuitry configured to be settable to at least one self-test configuration; and
    self-test controller circuitry, comprising:
        an analog configuration and sensing circuit configured to set said analog circuitry to said at least one self-test configuration and to sense test signals occurring in said analog circuitry set to said at least one self-test configuration;
        a data acquisition circuit configured to acquire and digitize said sensed test signals;

a fault event detection circuit configured to check said digitized sensed test signals against reference parameters;
a datapath configuration circuit coupled between said data acquisition circuit and said fault event detection circuit, the datapath configuration circuit configured to provide a plurality of digital processing datapath configurations for said digitized sensed test signals; and
test coordination circuitry having an input port configured to receive device control signals indicative of at least one self-test event;
wherein said analog configuration and sensing circuit is configured to set said analog circuitry to a corresponding at least one self-test configuration as a function of said device control signals received at said test coordination circuitry; and
wherein said test coordination circuitry comprises a finite state machine operating responsive to transition signals causing said test coordination circuitry to transition between idle states through a self-test state during which said analog configuration and sensing circuit sets said analog circuitry to said at least one self-test configuration, said finite state machine being configured to transition to a locked state in response to a self-test being aborted during said self-test state.

7. A method of operating an electronic device having analog circuitry and self-test controller circuitry for cooperating with the analog circuitry to perform testing of the electronic device, the method comprising:
activating the self-test controller circuitry;
in response to activation of the self-test controller circuitry, setting the analog circuitry to at least one self-test configuration as a function of device control signals received by a finite state machine that transitions through a self-test state in which the analog circuitry is set to the at least one self-test configuration and that transitions to a locked state in response to a self-test being aborted during the self-test state, and then sensing test signals occurring in the analog circuitry;
acquiring and digitizing the sensed test signals;
checking the digitized sensed test signals against reference parameters; and
generating at least one fault detection signal in response to the checking indicating that the digitized sensed test signals fail to match the reference parameters.

8. The method of claim 7, wherein activating said self-test controller circuitry comprises performing an auto-start control of said self-test controller circuitry.

9. The method of claim 7, wherein activating said self-test controller circuitry comprises activating at least one self-test event when analog configuration and sensing circuit is configured to set said analog circuitry to said at least one self-test configuration.

* * * * *